United States Patent [19]
Hetzel et al.

[11] Patent Number: 6,075,358
[45] Date of Patent: Jun. 13, 2000

[54] DEVICE IN A SEMICONDUCTOR MANUFACTURING INSTALLATION IN PARTICULAR FOR INTEGRATED CIRCUITS

[75] Inventors: Wolfgang Hetzel, Nattheim; Norbert Haueis, Kareth; Friedrich Wanninger; Georg Schlaffer, both of Regensburg; Alfred Schallert, Amberg; Peter Eigenstetter, Donaustauf; Stefan Schmausser, Ursensollen, all of Germany

[73] Assignee: Siemens Aktiengesellschaft, Munich, Germany

[21] Appl. No.: 09/005,067

[22] Filed: Jan. 9, 1998

[51] Int. Cl.[7] .................................................... G01R 1/04

[52] U.S. Cl. .............................................. 324/158.1

[58] Field of Search ................................. 324/158.1, 754, 324/758, 760, 765, 73.1

[56] References Cited

U.S. PATENT DOCUMENTS

| | | | |
|---|---|---|---|
| 4,776,747 | 10/1988 | Swapp et al. | 414/417 |
| 5,313,156 | 5/1994 | Klug et al. | 324/158.1 |
| 5,510,724 | 4/1996 | Itoyama et al. | 324/760 |
| 5,563,520 | 10/1996 | Terada | 324/754 |
| 5,920,192 | 7/1999 | Kiyokawa | 324/158.1 |

*Primary Examiner*—Josie Ballato
*Assistant Examiner*—Minh Tang
*Attorney, Agent, or Firm*—Herbert L. Lerner; Laurence A. Greenberg; Werner H. Stemer

[57] ABSTRACT

The fully automatic conveying system, a so-called handler, picks up, tests, inscribes, and packages finished mounted components in a semiconductor manufacturing plant. Each component is assigned a dedicated data record and it is accordingly automatically deposited in a selected package. The component is thus inscribed, classified, and packaged with a specific class identifier in dependence on the preceding tests.

11 Claims, 2 Drawing Sheets

DEVICE IN A SEMICONDUCTOR MANUFACTURING INSTALLATION IN PARTICULAR FOR INTEGRATED CIRCUITS

BACKGROUND OF THE INVENTION

Field of the Invention

The invention relates to a device in a semiconductor manufacturing installation, in particular for integrated circuits, with at least one electrical and mechanical test device, an inscription station and a final packaging station, in which the components are finally packaged for delivery.

Such devices are used at the end of production lines for electrical components, such as integrated circuits, in order to pick up the electrical components, which have already been mounted into housings, at the end of the production line, feed them to a marking station (e.g. a laser inscription station) and then deposit them into suitable packaging in a packaging station. In the inscription station, the housing of the electrical component is inscribed, by means of a laser, with a type designation, batch number, manufacturer detail, etc. In the packaging station, the electrical component is placed into suitable packaging according to customers' requests. As a packaging unit, the finished mounted and inscribed components can optionally be deposited in so-called plastic tapes, plastic tubes or plastic trays. Plastic tapes should in this case be understood to mean plastic belts having incorporated pockets into which the electrical components are placed. The pockets are then covered by a transparent cover film and welded to the cover film. These plastic tapes can be filled very rapidly. Plastic tubes are the sufficiently known plastic tubes into which the electrical components are successively filled. The plastic tubes are closed off at their ends by means of suitable cover caps. These plastic tubes have the disadvantage that the electrical components, in particular highly sensitive integrated circuits, can easily be damaged due to their mutually butting against one another. Plastic trays are parallelepipedal plastic frames provided with partitions in a chessboard pattern. One of the electrical components is respectively inserted into the individual chambers formed by the partitions. Such plastic trays provide the electrical components or integrated circuits inserted into the individual chambers with extremely good protection against transport damage.

The quality control of electrical components and the process control of production machines in the manufacture of electrical components, in particular integrated circuits, is extremely important in order to ensure that the components supplied by the manufacturer meet customers' requirements. To date, the quality control of electrical components or the process control of production machines has been carried out largely manually, off-line and after the manner of random sampling in the mounting of electrical components, in particular integrated circuits.

In this case, the monitoring of so-called marking and package defects after the laser inscription of the electrical components represents the last inspection before the components are packaged into the above-mentioned plastic tapes, tubes or trays. Marking defects should be understood to mean defects in the inscription of the component, and package defects should be understood to mean housing defects of the components. The materials are usually inspected with regard to marking and package defects after the laser marking by random sampling in loose subjective observation of the components. This arbitrary observation of the components in a random sampling manner takes place either immediately before the packaging of the electrical components or immediately after the laser marking of the components, the components being deposited onto a plate for the purpose of laser marking. In principle, it is possible to assist this random-sampling check of the components for marking and package defects by using a suitable camera. For this purpose, the camera must be directed at the inscribed upper side of the electrical component, the image of the component that is recorded by the camera being made visible on a monitor, thereby improving the ergonomics of visual inspection. When there are conspicuous marking and/or package defects, the handler can be stopped by the operator in order to rectify the causes of the defect in the production line and/or during laser marking.

The subjective observation of the components themselves or of the components via a monitor is unsatisfactory for reliable quality control. On the one hand, the operator is not able to check each of the components given high machine cycles of the production line, for example less than 600 msec. On the other hand, inattentiveness by the operator during random-sampling checks of the components can give rise to the situation whereby the operator overlooks defective components. Finally, it is extremely difficult for the operator to perceive small inscription defects or small housing defects on the electrical component visually.

Furthermore, in customary modern installations for manufacturing semiconductor components, the work steps "testing", "inscribing" and "packaging", are carried out at a plurality of individual installations and individual work stations. For this purpose, it is necessary to deposit the components repeatedly into "tubes" or "trays" as intermediate packaging, convey them to the corresponding work station and laboriously unpack them there in order further to test or to process the components. This necessitates a considerable handling outlay. The apparent and primary disadvantages include long handling times, a larger number of personnel involved therein and also large intermediate stores, so-called buffers, for keeping the components ready at the respective station. This last measure requires a great deal of space.

Furthermore, the sequence of different production steps one after the other on different machines leads to a long throughput time and to a long total production time. Moreover, the quality is reduced by the large number of processing steps, because the necessary repeated repacking of the components can easily lead to damage to the component and its supply leads.

It is also disadvantageous that once the tests have been performed on the components, the manufacturer of the components frequently desires that the components be separated into different quality and/or defect classes. In doing this, it has not been possible to date to preclude a mix-up or a mistake. For this reason, a high logistic outlay and testing outlay have been used to date in an attempt to keep this risk as low as possible.

Furthermore, quality documentation has been possible to date only in a very complicated and laborious manner owing to the large number of individual processes at different work stations.

SUMMARY OF THE INVENTION

It is accordingly an object of the invention to provide a device in a semiconductor manufacturing plant, particularly a manufacturing plant for integrated circuits, which overcomes the above-mentioned disadvantages of the heretofore-known devices and methods of this general type and which reduces handling times in production lines of such components to a considerable extent and also increases the yield.

With the foregoing and other objects in view there is provided, in accordance with the invention, a device in a semiconductor manufacturing installation, in particular for integrated circuit components, comprising:

at least one test station for testing manufactured semiconductor components for electrical and mechanical defects, an inscription station for marking components received from the test station, and a final packaging station for packaging components received from the inscription station for delivery;

a conveying system disposed at the test station, the inscription station, and the final packaging station, the conveying system automatically picking up components to be tested and supplying the components without any packaging and in a predetermined sequence to the at least one test station and to the inscription station and, from the inscription station to the final packaging station.

In other words, the objects of the invention are satisfied with the claimed improvement of the system in the context of the above-mentioned device for checking electrical components. The device has a conveying system, a so-called handler, in which the components are successively picked up automatically from a conveyor package of the semiconductor manufacturing installation, are fed without any packaging in a predetermined sequence automatically to the test stations and the inscription station and, finally, are automatically packaged in a selected final packaging station.

In accordance with an additional feature of the invention, the components arrive at the conveying system in a conveyor package of the semiconductor manufacturing installation, and the conveying system is adapted to sequentially pick the components from the conveyor package.

The individual machines that have previously been used are therefore replaced, according to the invention, by a single machine which carries out all of the individual work steps inline. The components are thereby removed from the conveyor package at the end of the production line and positioned into the individual processing stations by the conveying system. The stations are arranged in such a way that the individual work steps can proceed automatically in an ordered, previously defined sequence without the interposition of manual activity. Intermediate packaging is no longer necessary. This considerably reduces the handling times. Handling damage is essentially precluded. Intermediate stores for the components are not necessary. The risk of mixing up the components is precluded.

The parallel testing, inscribing and packaging of the components enables a distinct reduction in the throughput time and production time.

In accordance with an added feature of the invention, the final packaging station includes a plurality of packaging stations each for packaging the semiconductor components in a different final package and the conveying system is adapted to convey the components from the inscription station selectively to a given one of the plurality of packaging stations. The packaging stations are adapted to packaging the components selectively in plastic trays, tubes, or tapes. Packaging is effected in response to the specific customer request.

In accordance with an additional feature of the invention, the final packaging station includes a plurality of identical parallel packaging stations. It is possible to package the components in a classified batch manner depending on the previous test result.

In accordance with another feature of the invention, the system includes a control device connected to the conveying system and to the at least one test station. The control device stores a dedicated data record for each component tested in the test station, and controls the conveying system to convey the component to a selected one of the packaging stations in accordance with the data record. The specific data record is assigned to the individual component during the entire process. This makes it possible to ensure that the individual components are taken to the correct output station, e.g. a rejects station or the above-mentioned packaging stations.

The test results may also be forwarded to the inscription station by a control device that is suitable for this purpose, in order to provide each component with a corresponding class identification. A plurality of different identifications can be effected in any desired sequence. As a result, separate handling of the various classes is avoided and a plurality of classes are completed simultaneously. By this means, the components which are identified as being defective can be deposited in a rejects station in such a way that targeted further processing is possible.

The overall control of the device is preferably undertaken by a so-called master controller, which is connected via interfaces to so-called slave controllers of the individual subsystems (test stations, inscription station, packaging stations). This facilitates software-supported quality and defect documentation.

In accordance with again an added feature of the invention, the conveying system includes a support plate (e.g. a turntable), and including a loader for loading the components arriving from the semiconductor manufacturing installation onto the support plate for inscribing the component, and a gripping station automatically gripping the components from the support plate and automatically conveying the components to a selected one of the packaging stations.

In accordance with again an additional feature of the invention, the system further comprises an imaging device disposed above the plate for optically imaging the components on the plate.

In accordance with again a further feature of the invention, the conveying system has two rotating heads with pick-ups for picking-up and depositing the components on the respective rotating head.

A camera with a light source may be arranged above or at the plate in order optically to acquire the inscribed surface and the housing of the component to be inspected. This makes it possible to reduce to a minimum the amount of space for checking the electrical component in the handler. Since the components are deposited on the plate in any case in order to be provided with a predetermined inscription by the inscription station, it is possible optically to acquire the component from above immediately after the inscription operation. It is thereby advantageous that the component does not have to be picked up again and taken to a possibly remotely disposed camera. The optical acquisition of the electrical component is consequently possible in a very rapid manner.

In accordance with again other features of the invention, the inscription station is a laser inscription station and the system operates with a cycle time of less than about 600 msec.

In accordance with a concomitant feature of the invention, the control device is connected to the test station and is programmed to automatically stop the conveying system upon an occurrence of an error or a defect signal. This ensures that damaged components are not inadvertently packaged in the event of a defect. Once the conveying system has stopped, an operator can search for the cause of the defect and rectify it. As a result, only defect-free components are conveyed into the packaging unit by the handler.

Other features which are considered as characteristic for the invention are set forth in the appended claims.

Although the invention is illustrated and described herein as embodied in a device in a semiconductor manufacturing installation, in particular for integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
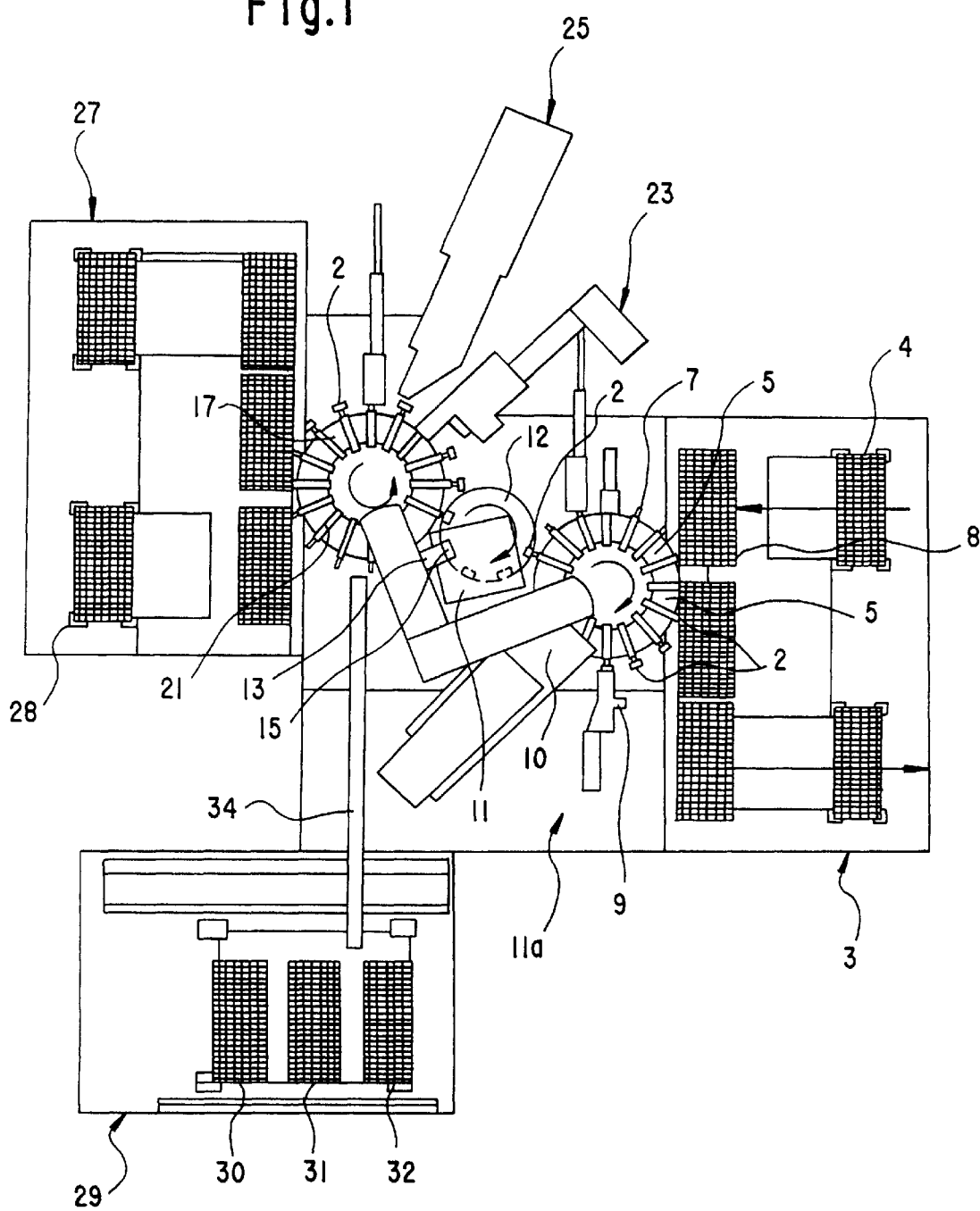
FIG. 1 is a plan view of a first exemplary embodiment of a conveying system according to the invention.

Referring now to the figures of the drawing in detail and first, particularly, to FIG. 1 thereof, there is seen a conveying system—hereinafter referred to as a handler—of the kind used at the end of a production line for integrated circuits. The handler is provided with the reference symbol 1.

The handler 1 has a first rotating head 5 (first indexing turntable) and a second rotating head 17 (second indexing turntable) on a work table 1a. A rotating plate 12, which will be referred to as a turntable 12, is arranged between the two rotating heads 5 and 17. The first rotating head 5 is situated on the right-hand side of the work table and has a multiplicity of arms 8 disposed in a star configuration. The arms 8 are provided, at their free ends, with a suction cup 7 or vacuum needles for taking up finished mounted integrated circuits by means of negative pressure. In the exemplary embodiment of FIG. 1, the rotating head 5 has sixteen arms 8 projecting as equidistant rays spaced at equal angles. The rotating head 5 rotates in the direction of the arrow illustrated on the rotating head 5, in the clockwise direction. With its vacuum needles or suction cups 7 located at the distal end, the arm 8 situated in the 3 o'clock position takes up a component 2 from the loading station 3 which is situated to the right of the work table of the handler 1. At the loading station 3, plastic trays or plastic frames 4 successively pass, as shown by the arrow on the loading station 3 in FIG. 1, into the vicinity of the 3 o'clock position of the first rotating head 5, in order that the arm respectively situated there can remove a component from the plastic frame 4 in order to feed it to test stations, provide it with a suitable inscription, inspect it and finally package it in a packaging station. It goes without saying that the individual chambers of the plastic frames 4 have to be aligned with the vacuum needles of the arm 8 in the 3 o'clock position of the rotating head 5 in such a way that simple suction by negative pressure and thus lifting of the component 2 on to the rotating head 5 are possible.

After the component 2 has been picked up in the 3 o'clock position, the rotating head 5 indexes in the clockwise direction in order to feed the seized component 2 to an electrical test station 9 in the 6 o'clock position. As is evident from FIG. 1, after rotating through 22.5°, the rotating head 5 in each case takes up a new component 2 from the plastic frame 4. Following the electrical test station 9, the component 2 is fed to a so-called lead inspection station 10 in approximately the 8 o'clock position. In the lead inspection station 10 the electrical leads on the component 2 are checked.

After the lead inspection station 10, the electrical component 2 is deposited by the rotating head 5 on a plate, in this case a turntable 12. In the exemplary embodiment of FIG. 1, this is done approximately in the 10 o'clock position of the rotating head 5. The turntable 12 likewise rotates in the clockwise direction, as shown by the arrow illustrated on the turntable 12.

After the component 2 has been deposited on the turntable 12 by the rotating head 5, the component 2 is fed to an inscription station 11 as a result of the turntable 12 being rotated through approximately 30° in the clockwise direction. For this purpose, the component 2 is deposited on the turntable 12 by the rotating head 5 in such a way that its upper side points in the direction of the observer of FIG. 1. It is understood, thereby, that the component 2 must be deposited in a suitable manner such that it will not slide away from its position and that it lies planar on the turntable 12. The inscription station 11 is disposed above the turntable in approximately the 6 o'clock position. A suitable inscription is applied in the inscription station 11, preferably by means of laser light, to the top of the component housing. The inscription applied may be, for example, a manufacturer identifier, a type designation, product classes, speed identification, etc. After a suitable inscription has been applied to the housing of the component 2 by the inscription station 11, the turntable 12 rotates further in the clockwise direction.

In approximately the 8 o'clock position of the turntable 12, an imaging unit 13 with camera and illumination unit is arranged above the turntable 12 in order to ascertain inline whether the component 2 that has been inscribed immediately beforehand has an inscription defect and/or housing defect. The camera 13 and illumination unit are part of an image processing unit in order optically to acquire the inscribed components 2 prior to packaging, compare them with a desired image and generate a defect signal in the event of a predetermined deviation. The total imaging processing system comprises the imaging unit 13 with camera and illumination unit, an image-processing unit in the form of a suitable computer with image processing software and an output unit at which the defect signal can be picked off. The image-processing system is explained in even more detail below.

In approximately the 10 o'clock position of the turntable 12, the components 2 that have been inscribed in the inscription station 11 and the components 2 that have in the meantime been checked for inscription defects and housing defects are taken up by a second rotating head 17. This second rotating head 17 has a similar configuration to the first rotating head 5. In the present exemplary embodiment, the second rotating head likewise has sixteen arms having suction cups 7 or vacuum needles arranged in each case on their distal ends. In the present exemplary embodiment of FIG. 1, the second rotating head 17 rotates in the anticlockwise direction, as illustrated by the arrow there. In approximately the 4 o'clock position of the second rotating head 17, the inscribed and tested components 2 are taken up and, depending on the customer desire, packaged in a suitable packaging station. Three different packaging stations 23, 25 and 27 are provided in the exemplary embodiment of FIG. 1. Situated in approximately the 2 o'clock position of the second rotating head is a so-called taping module 23, in which the components 2 can be placed into pockets in a plastic belt. After the components 2 have been placed into the pockets of the plastic belt, the taping module closes off the pockets with a transparent film.

A so-called tube module 25 is situated in approximately the 1 o'clock position of the second rotating head 17. There, the components 2 are placed into plastic tubes. A so-called tray module 27 is arranged in approximately the 9 o'clock position, which is largely similar to the loading station 3. Plastic frames are supplied on the tray module 27. The components 2 are placed into the individual chambers of the plastic frame 28.

As is furthermore evident from FIG. 1, a further station 29 having three plastic frames 30, 31, 32 lying next to one another is disposed at the lower end of the work table 1a of the handler 1. This further station 29 serves as a rejects station 29 in which defective components 2 are deposited. It is possible, for example, depending on which defects the components 2 have, to deposit components 2 having electrical defects in the plastic frame 30, components 2 having defects in the connecting leads in the plastic frame 31 and components having marking and/or inscription defects in the plastic frame 32. The separate deposition of the components 2 according to different defect causes enables the rejected components to be reworked in a targeted manner. The rejects station 29 receives the defective components via a mechanical feeding means 34, which accepts the defective component from the second rotating head 17 in approximately the 6 o'clock position.

It goes without saying that the handler 1 and the image processing system 13 are controlled by a suitable control device. It is possible, for example, to operate the handler 1 and the image processing unit 13 with a machine cycle time of about 600 msec. This means that every 600 msec a component 2 to be tested is removed from the loading station 3 by the first rotating head 5 and every 600 msec such a component 2, if it is not defective or if it is inscribed, is deposited in one of the packaging stations 23, 25 or 27. This high cycle time of the handler 1 enables high rationalization in the manufacture of electrical components, in particular integrated circuits. As a result of the presence of the image processing system 13 within the operating sequence of the handler 1, it is easily possible to investigate each of the components 2 to be packaged for inscription and/or housing defects. This ensures that each packaged component 2 is correctly inscribed and has no housing defects.

The image processing system 13 preferably has a CCD camera immediately following the inscription laser head. As a result, the components 2 can be inspected in direct proximity to the process. The handler 1 can be automatically stopped in the event of defects by virtue of the fact that the output unit of the image processing system is coupled to the control unit of the handler. As soon as a defect occurs, the handler can be effectively stopped, with the result that an operator can search for the defect causes. Furthermore, by storing the result data during the optical checking of the components 2, it is possible to obtain automatic creation of statistical information concerning defects that occur.

Figure 2:
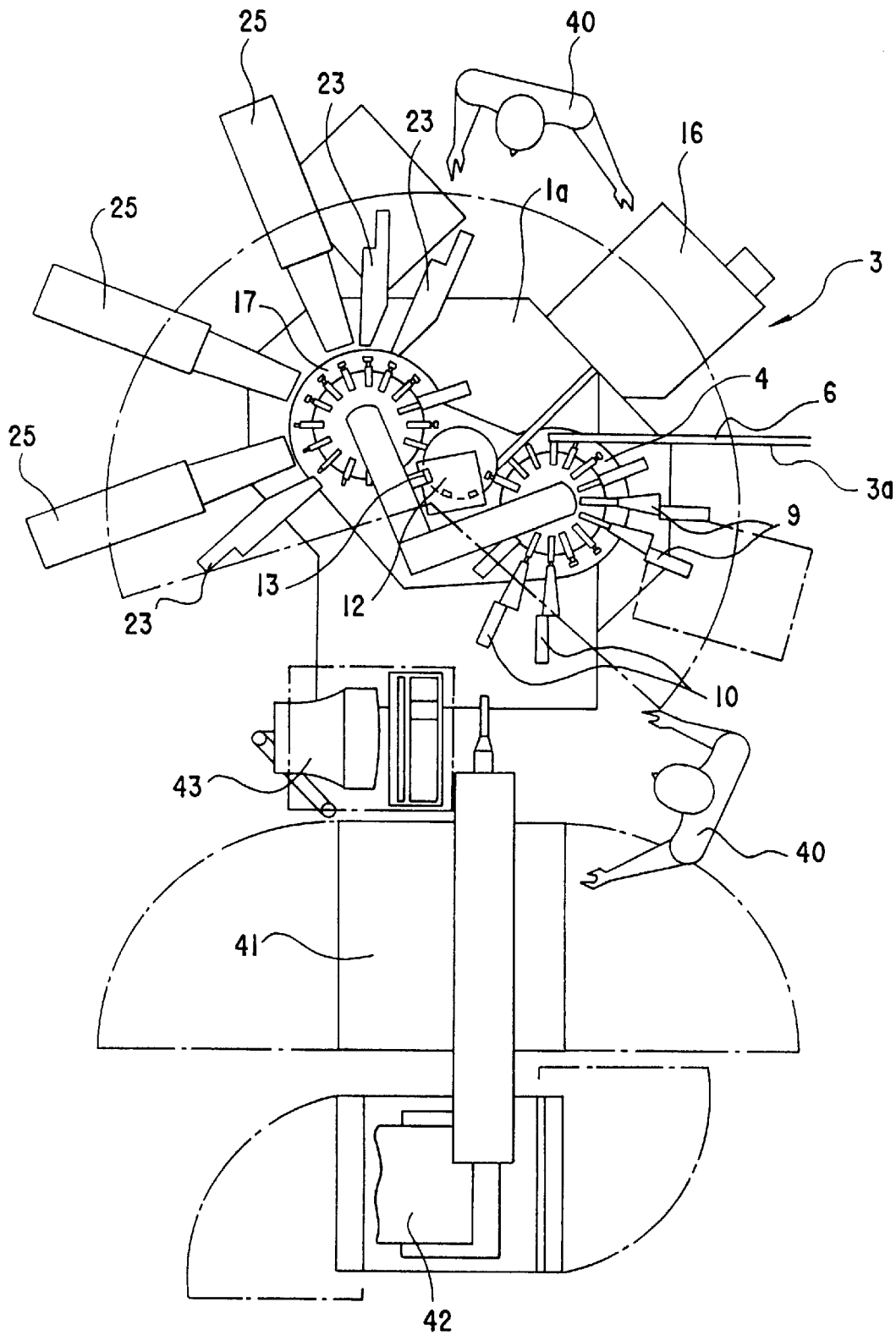
FIG. 2 is a plan view of a second exemplary embodiment of the conveying system according to the invention.

FIG. 2 illustrates a similar handler 1 to that in FIG. 1 and identical reference numerals represent the same components. Two operators 40 are additionally represented. In this exemplary embodiment, the individual components 2 are brought to the handler 1 by a loading station 16, which contains the components 2 in plastic tubes 6. After the components have been removed from the plastic tubes 6, the empty plastic tubes 6 are automatically conveyed away from the work table 1a of the handler 1 by the loading station 16.

The handler 1 has a further loading station 3, which is provided with an air rail 3a on which the components 2 can be conveyed directly from the production line.

Furthermore, this handler 1 contains three taping modules 23 coupled to the second rotating head 17, and three coupled tube modules 25.

Finally, FIG. 2 reveals a work table 41 with a printer 42 and a control monitor 43, from which the handler 1 can be controlled by an operator.

We claim:

1. A device in a semiconductor manufacturing installation, comprising:

at least one test station for testing finished mounted integrated circuits for electrical and mechanical defects, an inscription station for marking components received from the test station, and a final packaging station including a plurality of packaging stations for packaging components received from said inscription station for delivery;

a conveying system disposed at said test station, said inscription station, and said final packaging station, said conveying system automatically picking up integrated circuits to be tested and supplying the integrated circuits without any packaging and in a predetermined sequence to said at least one test station and to said inscription station and, from said inscription station to said final packaging station, said conveying system including a turntable, a first rotating head with pick-ups for picking up the integrated circuits arriving from the semiconductor manufacturing installation and for depositing the integrated circuits on said turntable, and a second rotating head with pick-ups for picking up the integrated circuits on said turntable and for depositing the integrated circuits in a given one of said plurality of packaging stations.

2. The device according to claim 1, wherein said plurality of packaging stations each package the integrated circuits in a different final package and said conveying system is adapted to convey the integrated circuits from said inscription station selectively to a given one of said plurality of packaging stations.

3. The device according to claim 2, wherein said plurality of packaging stations are adapted to package the integrated circuits selectively in packages selected from the group consisting of plastic trays, tubes, and tapes.

4. The device according to claim 1, wherein said final packaging station includes a plurality of identical, parallel packaging stations.

5. The device according to claim 1, wherein the integrated circuits arrive at said conveying system in a conveyor package of the semiconductor manufacturing installation, and said conveying system is adapted to sequentially pick the integrated circuits from the conveyor package.

6. The device according to claim 1, which further comprises a control device connected to said conveying system and to said at least one test station, said control device storing a dedicated data record for each integrated circuit tested in said test station, and said control device controlling said conveying system to convey the integrated circuit to a selected one of said plurality of packaging stations in accordance with the data record.

7. The device according to claim 1, wherein said inscription station and said at least one test station are connected to one another, and wherein said inscription station is operated to inscribe each component with a class identifier that depends on a respective test result in said test station.

8. The device according to claim 1, which further comprises an imaging device disposed above said turntable for optically imaging the integrated circuits on said turntable.

9. The device according to claim 1, wherein said inscription station is a laser inscription station.

10. The device according to claim 1, wherein said conveying system operates with a cycle time of less than about 600 msec.

11. The device according to claim 1, which further comprises a control device controlling said conveying system, said control device being connected to said test station and being programmed to automatically stop said conveying system upon an occurrence of an error.

* * * * *